United States Patent [19]
Nakao

[11] Patent Number: 5,654,568
[45] Date of Patent: *Aug. 5, 1997

[54] SEMICONDUCTOR DEVICE INCLUDING NONVOLATILE MEMORIES

[75] Inventor: Hironobu Nakao, Kyoto, Japan

[73] Assignee: Rohm Co., Ltd., Kyoto, Japan

[*] Notice: The term of this patent shall not extend beyond the expiration date of Pat. No. 5,341,010.

[21] Appl. No.: 549,642

[22] Filed: Oct. 27, 1995

Related U.S. Application Data

[63] Continuation of Ser. No. 285,884, Aug. 4, 1994, abandoned, which is a continuation of Ser. No. 985,792, Dec. 3, 1992, abandoned.

[30] Foreign Application Priority Data

Jan. 17, 1992 [JP] Japan .................................. 4-006804
Jan. 31, 1992 [JP] Japan .................................. 4-016496

[51] Int. Cl.$^6$ .................................................. H01L 29/792
[52] U.S. Cl. ........................... 257/324; 257/326; 257/314; 257/295
[58] Field of Search .................................. 257/314, 315, 257/324, 326, 295, 316; 365/184

[56] References Cited

U.S. PATENT DOCUMENTS

| | | | |
|---|---|---|---|
| 4,592,802 | 6/1986 | Deleonibus et al. | 156/644 |
| 4,847,808 | 7/1989 | Kobatake | 365/184 |
| 5,091,326 | 2/1992 | Haskell | 437/43 |
| 5,146,299 | 9/1992 | Lampe et al. | 257/314 |
| 5,194,924 | 3/1993 | Komori et al. | 257/316 |
| 5,341,010 | 8/1994 | Shimoji | 257/326 |

FOREIGN PATENT DOCUMENTS

| | | | |
|---|---|---|---|
| 0463510 | 2/1992 | European Pat. Off. | 257/314 |
| 55-87490 | 7/1980 | Japan | 257/324 |
| 2025130 | 1/1980 | United Kingdom | 257/314 |

*Primary Examiner*—J. Carroll
*Attorney, Agent, or Firm*—Morrison Law Firm

[57] ABSTRACT

The present invention provides a nonvolatile semiconductor memory which has advantages permitting the cell of the memory circuit to integrate, the memory circuit to be easy to manufacture, and the manufacturing expense to be cut down. The nonvolatile memory 21 comprises a P type well for which a N+ type source 4 and a N+ type drain 3 are provided. A surface of a space between the source 4 and the drain 3 comprises a first portion 10a and a second portion 10b. An insulating layer 6 for holding electrons spans the surface of the space. A memory gate electrode 5 is on the insulating layer 6 and spans the first portion 10a. An insulating body 23 is formed on the surface of the insulating layer 6 so that it connects to the memory gate electrode 5 through an insulating layer 8 and spans the second portion 10b.

27 Claims, 12 Drawing Sheets

FIG. 1 (Prior Art)
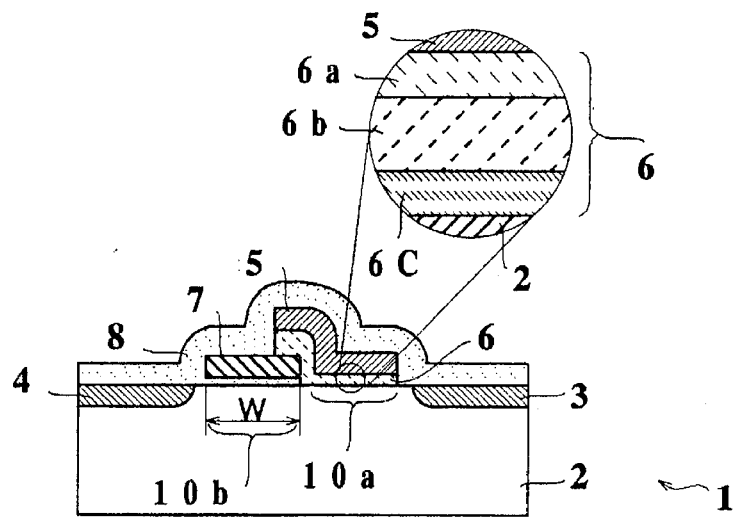
FIG. 2A (Prior Art)
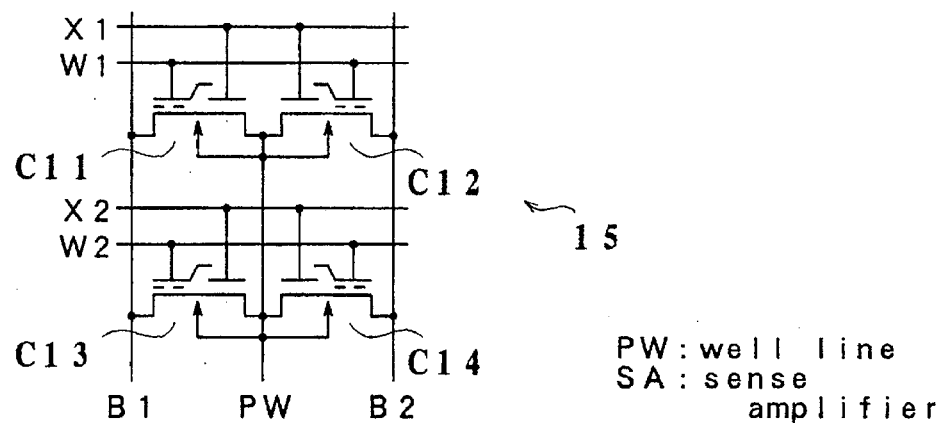
PW: well line
SA: sense amplifier
FIG. 2B (Prior Art)
| mode | selected memory | X1 | X2 | W1 | W2 | B1 | B2 | PW |
|---|---|---|---|---|---|---|---|---|
| writing | C11 | -4 | -4 | 5 | -4 | -4 | 5 | -4 |
| erasing | C11,12 | -4 | -4 | -4 | 5 | 5 | 5 | 5 |
| reading | C11 | 5 | 0 | 0 | 0 | SA | OPEN | 0 |

|  | BL1 | BL2 | WL1 | WL2 | S1 | PW |
|---|---|---|---|---|---|---|
| writing | 0 | 7 | 10 | 0 | 0 | 0 |
| erasing | OPEN | OPEN | 0 | 10 | OPEN | 10 |
| reading | 0 | OPEN | 2 | 0 | 5 | 0 |

SA: sense amplifier

|         | BL1 | BL2 | WL1-1 | WL1-2 | WL2-1 | WL2-2 | S1 | PW |
|---------|-----|-----|-------|-------|-------|-------|----|----|
| writing | 0 | 5 | 5 | 5 | 0 | 0 | 0 or OPEN | 0 |
| erasing | 0 | 0 | 0 | 0 | 0 | 5 | 0 | 5 |
| reading | SA | 0 or OPEN | 5 | 0 | 0 | 0 | 5 | 0 |

SEMICONDUCTOR DEVICE INCLUDING NONVOLATILE MEMORIES

SPECIFICATION

This application is a continuation of application Ser. No. 08/285,884, filed Aug. 4, 1994, now abandoned, which is a continuation of application Ser. No. 07/985,792, filed Dec. 3, 1992, now abandoned.

BACKGROUND OF THE INVENTION

1. Field of the Invention

The present invention relates to a semiconductor nonvolatile memory and, more particularly, improvement in integration, reliability of operation and productivity thereof.

2. Description of the Prior Art

In related art, there is an instance of semiconductor nonvolatile memory 1 as shown in FIG. 1. Referring to FIG. 1, a P type well 2 includes a drain 3 and a source 4, the two region forming a space comprising of a region 10a and a region 10b. Between the region 10a and a memory gate electrode 5 is an insulating layer 6 for holding electrons. This insulating layer 6 have a structure of three layer: a silicon dioxide layer 6a, a silicon nitride layer 6b, a silicon dioxide layer 6c. The silicon nitride layer 6b is where electrons can be trapped by bias between the well 2 and the memory gate electrode 5. The insulating layer 6 and a silicon dioxide layer 8 insulate a control gate electrode 7 from both the memory gate electrode 5 and the region 10b.

It is arranged that the region 10b changes from nonconductive into conductive when a stable positive voltage is applied to the control gate electrode 7 and that the region 10a changes from conductive into nonconductive when a stable positive voltage is applied to the gate electrode 5.

The operations of writing data into and reading data from the nonvolatile memory 1 will be described. To write data into the memory 1, a positive voltage such as 9 V is applied to the memory gate electrode 5 relative to the drain 3 and the source 4, whereby electrons in the P type well 2 move into the insulating layer 6 and get trapped therein. This change in charge distribution due to the trapped electrons cause the region 10a to change from conductive into nonconductive. These electrons remain trapped in the insulating layer 6 even when the voltage applied to the memory gate electrode 5 is cut off. This state wherein electrons is trapped in the insulating layer 6 is referred to as "write state" hereinafter.

In the reading operation, a positive voltage, which is larger than the threshold voltage for the conductive channel of the region 10b, is applied to the control gate electrode 7 relative to the drain 3 and the source 4, whereby the region 10b changes from nonconductive into conductive.

Therefore, when the insulating layer 6 has no electrons trapped therein and a voltage is applied to the drain 3 relative to the source 4 a current flows between the drain 3 and the source 4. It is because the regions 10a and 10b are conductive. Conversely, when the insulating layer 6 has electron trapped therein and a voltage is applied to the drain 3 relative to the source 4, no current flows between the drain 3 and the source 4. It is because the region 10a is nonconductive.

As is described above, it can be determined whether or not the memory 1 is in "write state", by determining whether or not a current flow between the drain 3 and the source 4.

To erase data from the nonvolatile memory, a positive voltage is applied to the P type well 2 relative to the memory gate electrode 5. This application of the voltage cause the electrons trapped in the insulating layer 6 to return the well 2. That mean the data of the memory has been erased.

A memory circuit can be constructed by using the above-mentioned memories 1 which array in rows and columns. The memory circuit is shown in partial view of equivalent circuit 15 in FIG. 2A. As shown in FIG. 2A, each word line W connects with all control memory gate electrodes of memories arrayed in a row and each word line X connects with all control gate electrodes of memories arrayed in a row and each bit line connects with all drain of memories arrayed in a column and a well line PW connects with sources of all of the memories arrayed in rows and columns as well as wells for each of them.

So as not to write data into and read data from memories but a desired memory, the following means can select a desired memory from the memory circuit.

FIG. 2B is a table showing one of combinations of voltages applied to each of the individual lines at writing, erasing and reading operations, the combination being enable the memory circuit to select a desired memory, for example, a memory C11 at writing and reading operations.

More specifically, to write data into the selected memory C11, a voltage of 5 V is applied to both the word line W1 and the bit line B2 and a voltage of −4 V is applied to each of the other individual lines. That means that a positive voltage of 9 V (volts) is applied to the memory gate electrode 5 of the selected memory C11 relative to the well 2, the source 4 and the drain 3. As a result of the application, the insulating layer 6 of the selected memory C11 get electrons trapped therein.

Referring to the nonselected memory C12, the voltage of 5 V is applied to the memory gate electrode 5 and thereby the region 10a change into conductive. The voltage of 5 V applied to the drain 3 can travel into the region 10a. That is, there is no potential difference between the memory gate electrode 5 and the well 2. Therefore, the insulating layer 6 of the nonselected memory C12 gets no electron trapped therein. Referring to the other nonselected memories C13 and C14, the voltage of −4 V is applied to the memory gate electrode 5. Therefore, the insulating layer 6 gets no electron trapped therein, respectively.

Note that the voltage of −4 V is applied to the word lines X1 and X2 in order that all the regions 10b of memories C11, C12, C13 and C14 get nonconductive. Therefore, the voltage of 5 V applied to the bit line B2 can travel into the region 10a of the memory C12 without a loss.

Reading operation is effected by applying a voltage of 5 V to a word line X1, applying a positive voltage to the bit line B1 connecting to a sense amplifier, leaving the bit line B2 floating and applying a voltage of 0 V to each of the other individual lines.

Referring to the selected memory C11, the region 10b is conductive because the voltage of 5 V is applied to the control gate electrode 7. When the memory C11 have electrons trapped in the insulating layer 6 the region 10a is nonconductive. Therefore, no current flows through the bit line B1. Conversely, when the memory C11 have no electron trapped in the insulating layer 6 the region 10a is conductive. Therefore, a current flows through the bit line B1.

Referring to the nonselected memory C12, the region 10b is conductive because the voltage of 5 V is applied to the control gate electrode 7. However, since the source 4 is in a voltage of 0 V applied and the bit line B2 is left floating, no current flows through the bit line B2 even when the region 10a is conductive. Referring to the other nonselected memories C13 and C14, the region 10b is nonconductive respectively because the word line X2 is in a voltage of 0 V applied. Therefore, no current flows through the bit line B1 and through the bit line B2 respectively.

As is described above, in the memory circuit, data can be written into and read from a desired memory.

Meanwhile, erasing operation is effected by applying a voltage of −4 V to all of the word line X1, the word line X2 and the word line W1, and applying a voltage of 5 V to the other individual lines.

Referring to the selected memory C11 and C12, since the well line PW have the voltage of 5 V and the memory gate electrode 5 have the voltage of −4 V, the electric field developed between the well 2 and the memory gate electrode 5 make electrons in the insulating layer 6 move into the well 2. That means the data of the memories C11 and C12 has been erased.

Referring to the nonselected memories C13 and C14, since the well 2 have the voltage of 5 V and the memory gate electrode 5 have the voltage of 5 V, no electric field developed between the well 2 and the memory gate electrode 5. Therefore, the data of the memories C13 and C14 is left unchanged.

The above-mentioned memory circuit, however, have the following problem.

Each of the memories in the memory circuit comprises two field effect transistors with the common source and the common drain.

This two field effect transistors bar the memory cell and the memory circuit from integrating and being manufactured easily.

Meanwhile, in order to control the conductivity of the region 10b by application of electric field between the well 2 and the control gate electrode 7, it is necessary to arrange a certain width of the region 10b correctly in manufacturing process. This width W is determined by a width of a photoresist pattern using as a mask. In lithography technique, it is difficult to meet the photoresist pattern mask to a predetermined position in the substrate. Therefore, it is difficult to arrange the region 10b with a predetermined width.

SUMMARY OF THE INVENTION

Accordingly, it is an object of the present invention to provide nonvolatile semiconductor memory that comprises one-transistor cells and that has advantages in integrating the cell and in cutting down the manufacturing expense.

A semiconductor device including nonvolatile memories according to one embodiment of the present invention comprises:

a) a substrate of semiconductor, b) a first region formed in the surface of the substrate, c) a second region formed in the surface of the substrate and defining a space between the first region and the second region, the surface of the space comprising a first portion and a second portion, d) an insulating layer for holding electrons spanning the first portion, e) a control electrode being on the insulating layer and spanning the first portion, and f) an insulating body which spans the second portion and is adjacent to the control electrode.

A semiconductor device including nonvolatile memories according to another embodiment of the present invention comprises:

a) a substrate of semiconductor, b) a first region formed in the surface of the substrate, c) a second region formed in the surface of the substrate and defining a space between the first region and the second region, the surface of the space comprising a first portion and a second portion, d) a film of ferroelectric material spanning the first portion, e) a first control electrode being on the film of ferroelectric material and spanning the first portion, f) an insulating body which is on the film of ferroelectric material, is adjacent to the first control electrode, and spans the second portion, and g) a switching element connecting with one of the two regions adjacent to the first portion, the switching element having a second control electrode and a third region formed in the surface of the substrate.

A method for manufacturing a semiconductor device including nonvolatile memories according to one embodiment of the present invention comprises the steps of:

a) preparing a substrate of semiconductor, b) depositing an insulating layer for holding electrons on all the surface of the substrate, c) covering a part of the surface of the insulating layer with a control electrode wherein a portion of the surface of the substrate spanned by the control electrode is defined as a first portion, d) covering a part of the surface of the insulating layer adjacent to the control electrode with an insulating body wherein a portion of the surface of the substrate spanned by the insulating body is defined as a second portion e) implanting a dopant into the substrate using both the insulating body and the control electrode as a mask so that a first region and a second region are created in the substrate, A method for manufacturing the semiconductor device including nonvolatile memories according to another embodiment of the present invention comprises steps of:

a) preparing a substrate of semiconductor, b) forming a structure on the surface of the substrate wherein an insulating layer is formed on the surface of the substrate and a second control electrode is formed on the insulating layer, c) forming a film of ferroelectric material on the surface of the substrate and forming a first control electrode on the surface of the ferroelectric film, wherein a portion of the surface of the substrate spanned by the ferroelectric film is defined as a second portion, d) forming an insulating body on the ferroelectric film so that the insulating body is adjacent to the first control electrode wherein a portion of the surface of the substrate spanned by the insulating body is defined as a first portion, and e) implanting a dopant into the semiconductor substrate using the first electrode and the second electrode as a mask so that a first region, a second region and a third region are created in the semiconductor substrate, A method for operating memories, which comprise a substrate of semiconductor, a source formed in the surface of the substrate, a drain formed in the surface of the substrate and defining a space between the source and the drain, the surface of the space comprising a first portion and a second portion, an insulating layer for holding electrons spanning the first portion and the second portion, a memory gate electrode being on the insulating layer and spanning the first portion, and an insulating body which spans the second portion and is adjacent to the memory gate electrode, according to one embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting a source line to all the sources of the memories arrayed in rows and columns, e) to write data into a desired memory, applying a first programming voltage to a gate line connecting with the desired memory and applying a voltage to the drains of the undesired memories in order not to write data into the undesired memories, and f) to read data from a desired memory, determining whether or not a current flows through a drain line connecting to the drain of the desired memory when a first sense voltage is applied to a gate line connecting with the memory gate electrode of the desired memory as well as applying a first reading voltage to the source line.

A method for operating memories, which comprise a substrate of semiconductor, a source formed in the surface of the substrate, a second region formed in the surface of the substrate and defining a space between the source and the second region, the surface of the space comprising a first portion and a second portion, a film of ferroelectric material spanning the first portion and the second portion, a memory gate electrode being on the film of ferroelectric material and spanning the first portion, an insulating body which is on the film of ferroelectric material, is adjacent to the memory gate electrode, and spans the second portion, and a switching element Connecting with one of the source and the second region adjacent to the first portion, the switching element having a drain gate electrode and a drain formed in the surface of the substrate, according to another embodiment of the present invention comprises steps of:

a) arraying the memories in rows and columns, b) connecting each of drain lines to all the drains of the memories arrayed in a row, c) connecting each of gate lines to all the memory gate electrodes of the memories arrayed in a column, d) connecting each of drain gate lines to all the drain gate electrode of the memories arrayed in a column, e) connecting a source line to the sources of all the memories arrayed in rows and columns, f) to write data into a desired memory, applying a second programming voltage to a gate line connecting with the desired memory and applying a voltage to the drains of the undesired memories in order not to write data into the undesired memories, and g) to read data from a desired memory, determining whether or not a current flows through a drain line connecting to the drain of the desired memory when a second sense voltage is applied to a gate line connecting with the memory gate electrode of the desired memory as well as applying a second reading voltage to the source line.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a sectional view showing schematically nonvolatile memory 1 according to related art.

FIG. 2A is a partial equivalent view showing a memory circuit constructed by using the nonvolatile memory 1 and FIG. 2B is a table showing an example of combinations of voltage applied to each of the individual lines at writing, erasing and reading operation.

DETAILED DESCRIPTION OF THE INVENTION

An embodiment according to the present invention will be described with reference to the figures.

Figure 3:
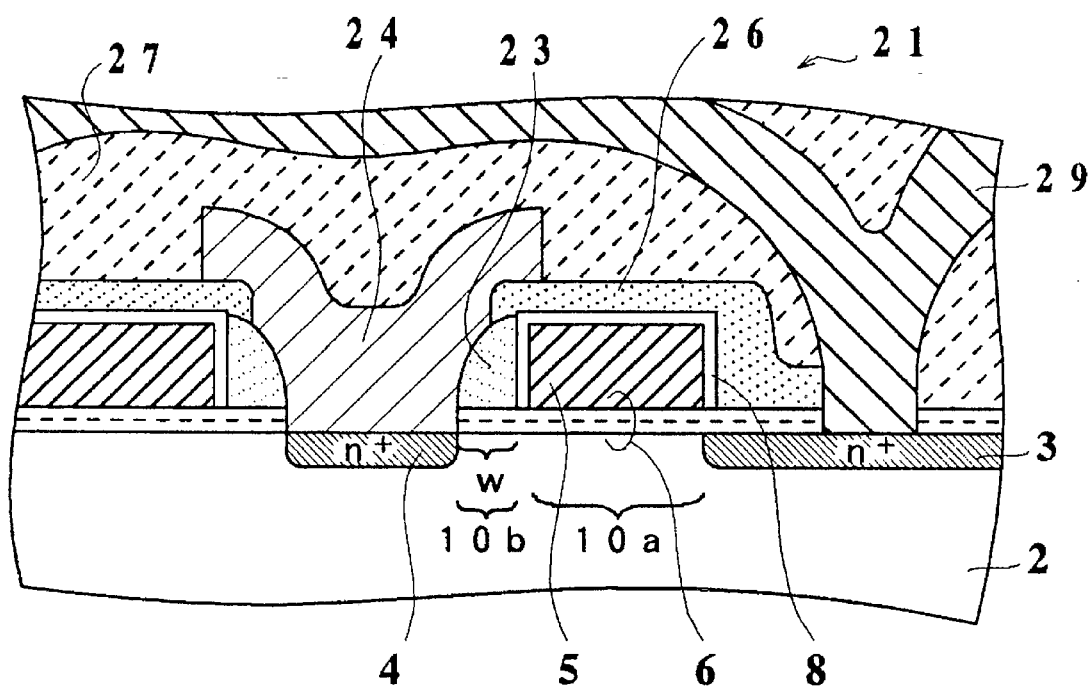
FIG. 3 is a sectional view showing schematically a nonvolatile memory 21 according to one embodiment of the present invention.

FIG. 3 shows a nonvolatile memory 21 according to the embodiment of the present invention. Referring to FIG. 3, the nonvolatile memory 21 comprises a substrate of semiconductor in which a P type well 2 is formed, for the surface of the well 2 a source 4 of a first region and a drain 3 of a second region being provided. Both the source 4 and the drain 3 is a diffusion layer of N+ type conductivity. A surface of a space between the source 4 and the drain 3 comprises a first portion 10a and a second portion 10b, the conductivity of which can be controlled by application of electric field.

An insulating layer 6 for holding electrons spans the surface of the space comprising the first portion 10a and the second portion 10b, and have structure of three layer: a silicon dioxide layer 6a, a silicon nitride layer 6b, a silicon dioxide layer 6c, as the memory explained in Description of the Prior Art. The silicon nitride layer 6b is where electrons can be trapped by applying a bias between the well 2 and a memory gate electrode 5 of a control electrode, the memory gate electrode 5 being on the insulating layer 6 and spanning the first portion 10a. An insulating body 23 is on the insulating layer 6 and connected the memory gate electrode 5 through a thin insulating layer 8, spanning the second portion 10b.

The insulating layer 8 is covered with an insulating layer 26. A first region electrode 24 attaches to the source 4. The entire surface of both the insulating layer 26 and the first region electrode 24 is covered with an insulating layer 27 on which is a bit line 29 of aluminum connecting to all drains 3 arrayed in a row (not shown).

Figures 7A, 7B:
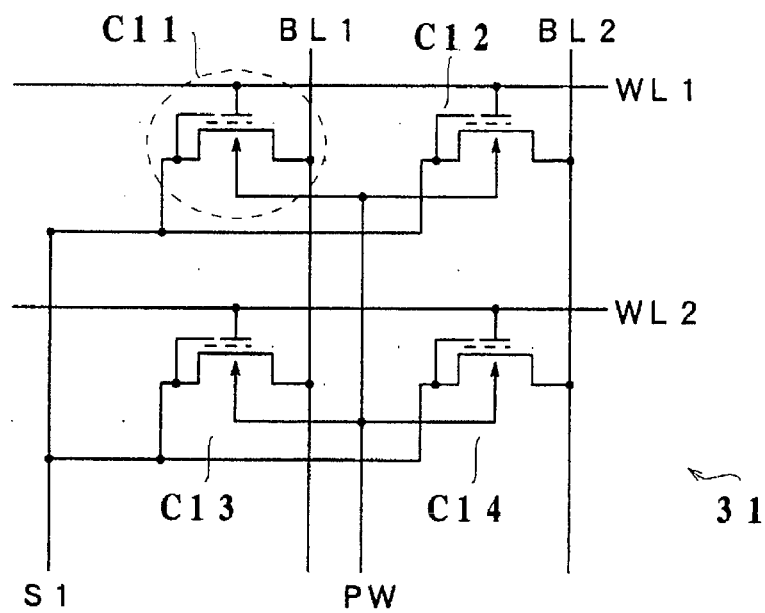
FIG. 7A is a partial equivalent view showing memory circuit 31 constructed by using the nonvolatile memory 21 and FIG. 7B is a table showing an example of combinations of voltages applied to each of the individual lines at erasing, writing and reading operation.

A memory circuit 31 can be composed of the above-mentioned memories 21 which array in rows and columns. The memory circuit 31 is shown in partial view of equivalent circuit in FIG. 7A. As shown in FIG. 7A, each of the word lines WL1 and WL2 of gate lines connects with all the memory gate electrodes 5 of memories arrayed in a row, each of the bit lines BL1 and BL2 of drain lines connects with all the drains of memories arrayed in a column, a source line S1 connects with all the source 4 of memories arrayed in rows and columns and a well line PW connects with all the well 2 of the memories arrayed in rows and columns.

So as not to write data into and read from memories but a desired memory, the following means can select the desired memory from the memory circuit 31.

FIG. 7B is a table showing one of combinations of voltages applied to each of the individual lines at writing, erasing and reading operation, the combination permitting the memory circuit to select the desired memory, specifically, a memory C11 at writing and reading operation.

More specifically, to write data into the selected memory C11, a "first programming" voltage of 10 V is applied to the word line WL1, a voltage of 7 V is applied to the bit line BL2 and a voltage of 0 V is applied to the other individual lines.

Returning to FIG. 7A and referring to the memory C11, the memory gate electrode 5 have a positive potential relative to all of the well 2, the source 4 and the drain 3, and thereby electrons in the well 2 get trapped in the insulating layer 6.

Note that "first programming" voltage is a voltage applied to the memory gate electrode 5 relative to all of the well 2, the source 4 and the drain 3 whereby electrons in the well 2 move to the insulating layer 6 and get trapped therein.

Referring to the nonselected memory C12, the first portion 10a is conductive because the first programming voltage of 10 V is applied to the memory gate electrode 5 relative to the drain 3. Therefore, as the voltage of 7 V is applied to the drain 3 the first portion 10a get a voltage of 7 V. At that time, there does not produce a potential difference between the memory gate electrode 5 and the well 2 enough to have electrons trapped in the insulating layer 6.

Referring to the other nonselected memories C13 and C14, both of the second portions 10b is nonconductive because a voltage of 0 V is applied to the memory gate electrode 5 relative to the drain 3.

Note that the second portion 10b of memories C12 and C14 remain nonconductive because of the voltage of 0 V applied to the source line S1. Therefore, the voltage of 7 V applied to the bit line BL2 can travel into the second portion 10a of the memory C12 without a loss.

Reading operation is effected by applying a "first sense" voltage of 2 V to the word line WL1, applying a "first reading" voltage of 5 V to the source line S1, leaving the bit line BL2 floating and applying a voltage of 0 V to each of the other individual lines.

Note that "first sense" voltage is a voltage which lies between such a minimum voltage applied to the memory gate electrode 5 relative to the well 2 that the first portion 10a can change from nonconductive into conductive when the insulating layer 6 have electrons trapped therein, and such a minimum voltage applied to the memory gate electrode 5 relative to the well 2 that the first portion 10a changes from nonconductive into conductive when the insulating layer 6 have no electrons trapped therein.

Therefore, when electrons are trapped in the insulating layer 6 and the sense voltage is applied to the memory gate electrode 5, the first portion 10a changes from nonconductive into conductive. Meanwhile, when electrons are not trapped in the insulating layer 6 the first portion 10a remains nonconductive even when the sense voltage is applied to the memory gate electrode 5.

Note that when "first reading" voltage is applied to the source 4 whereby the second portion 10b change from nonconductive into conductive without breaking down the insulation of PN unction between the source and the well, and the drain and the well. Therefore magnitude of the first reading voltage depends on the width W of the second portion 10b. In this embodiment the first reading voltage is 5 V as the width W of the second portion 10b is 0.2 μm.

Returning to FIG. 7A and referring to the selected memory C11, the second portion 10b is conductive because the depletion layer generated in PN junction between the N type source and the P type well is enlarged by application of the first reading voltage of 5 V to the source line S1 (see FIG. 3).

When the insulating layer 6 have electrons trapped therein, even when the sense voltage of 2 V is applied to the word line WL1 the first portion 10a remains nonconductive. Therefore, no current flows between the source 4 and the drain 3. Conversely, when the insulating layer 6 have no electrons trapped therein and the sense voltage of 2 V is applied to the word line WL1 the first portion 10a change into conductive. Therefore, a current flows between the source 4 and the drain 3.

Referring to the nonselected memory C12, the second portion 10b is conductive because the first reading voltage of 5 V is applied to the source line S1. The bit line BL2 is left floating. Therefore, no current flows between the source 4 and the drain 3 even when the first portion 10a is conductive. Referring to the nonselected memories C13 and C14, because the word line WL2 have the voltage of 0 V applied thereto and both of the second portions 10b is nonconductive accordingly, no current flows between the source 4 and the drain 3 respectively.

At that time, a sense amplifier (not shown) connecting to the bit line BL1 can detect if or not a current flows through the bit line BL1.

As is described above, in the memory circuit 31, data can be written into and read from a desired memory.

Meanwhile, erasing operation is effected by applying a voltage of 10 V to both the well line PW and the word line WL2, applying a voltage of 0 V to the word line WL1, and leaving the bit lines BL1 and BL2, and the source line S1 floating.

Referring to the selected memories C11 and C12, since the well line PW have the voltage of 10 V and the memory gate electrode 5 have the voltage of 0 V, the electric field developed between the well 2 and the memory gate electrode 5 make electrons in the insulating layer 6 move into the well 2. That means the data of the memories has been erased.

Referring to the nonselected memories C13 and C14, since the well 2 have the voltage of 10 V and the memory gate electrode 5 have the voltage of 10 V, no electric field develops between the well 2 and the memory gate electrode 5. Therefore, the data of the memories is left unchanged.

Note that when the voltage of 10 V is applied to both the word line WL2 and the word line WL1 data can be erased from all the memories at the same time.

As is described above, the memory circuit 31 is characterized in that the insulating body 23 is connecting to the memory gate electrode 5 through the insulating layer 8 and spanning the second portion 10b.

Therefore, it is effected by applying a voltage to the first region electrode 24 to control the conductivity of the second portion 10b. As the result of this, compared with the memory circuit constructed using by two-transistor cell, the above-mentioned memory circuit have advantages in integrating the memory circuit as well as its memory cell, in productivity thereof and in cutting down the manufacturing expense.

The manufacturing process for a memory circuit constructed using by the memory cells 21 will be described below.

Figure 4A:
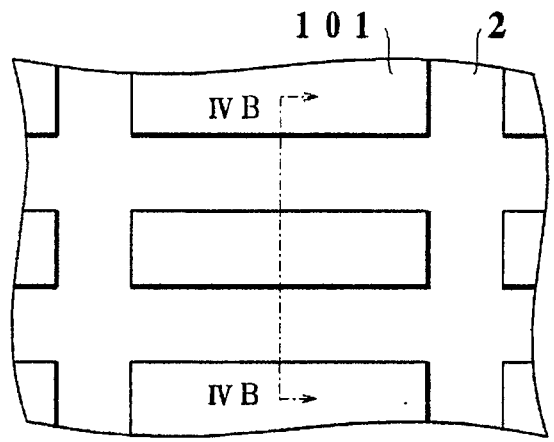
FIGS. 4A through 4E are views showing the manufacturing process of the memory circuit 31.
Figure 4B:
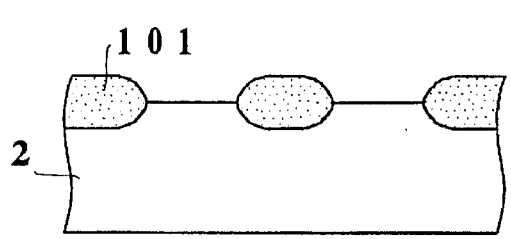

Field oxide layers 101 are formed in a well 2 which are provided for a substrate of semiconductor as shown in FIG. 4A by Local Oxidation of Silicon (LOCOS) technique to divide the substrate into the plural insulated islands. Note that FIG. 4B is a IVB—IVB sectional view to FIG. 4A. In the embodiment, the depth of the field oxide layer 101 is 600 nm.

Figure 4C:
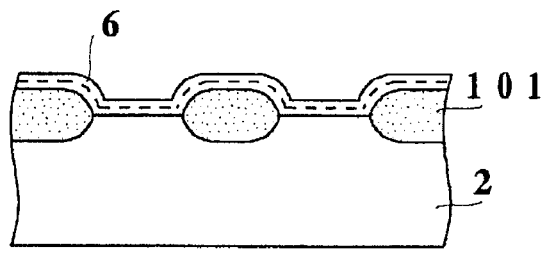

After cleaning the substrate, a silicon dioxide layer 2 nm in thickness is formed on the substrate by partial oxidation technique. A silicon nitride layer 15 nm in thickness is deposited on top of the silicon dioxide layer by Low pressure CVD (chemical vapor deposition) technique. A silicon dioxide layer 5 nm in thickness is formed on the silicon nitride by wet oxidation technique. A insulating layer for holding electrons is comprising of the three layer applied in this way as shown in FIG. 4C.

Figure 4D:
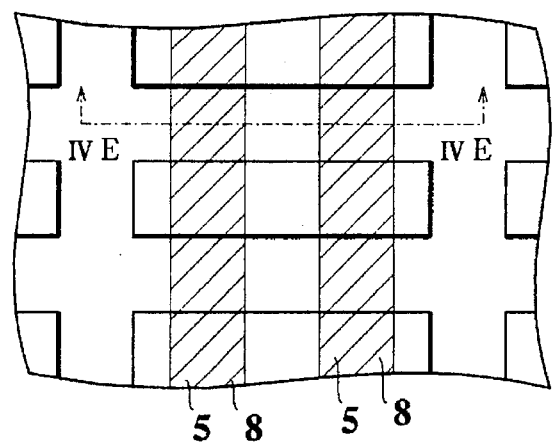
Figure 4E:
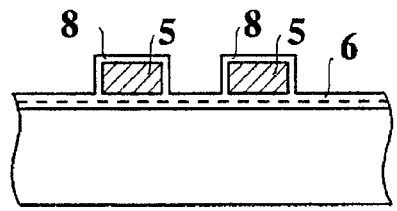

Thereafter, as shown in FIG. 4D, layers of polycide is deposited on top of the insulating layer 6 and form into a memory gate electrode 5 by etching technique. FIG. 4E is a IVE—IVE sectional view to FIG. 4D.

Figure 5A:
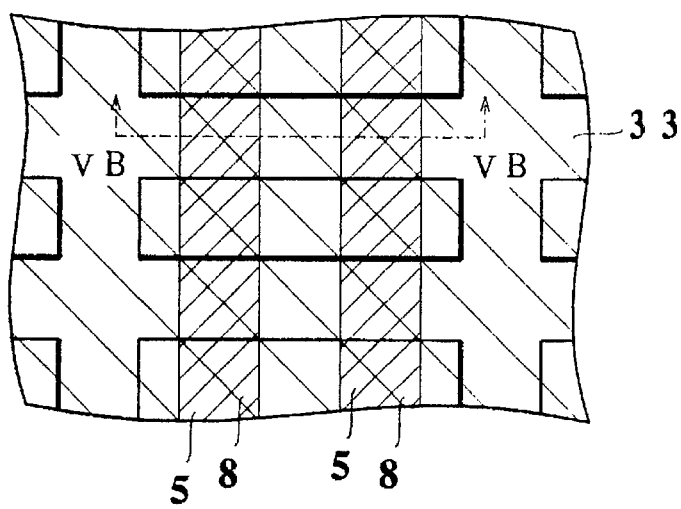
FIGS. 5A through 5D are views showing the manufacturing process of the memory circuit 31.
Figure 5B:
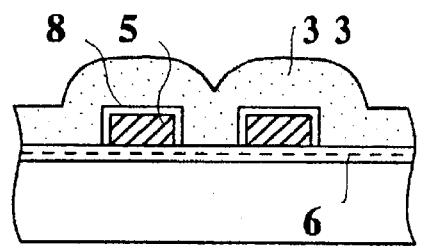
Figure 5C:
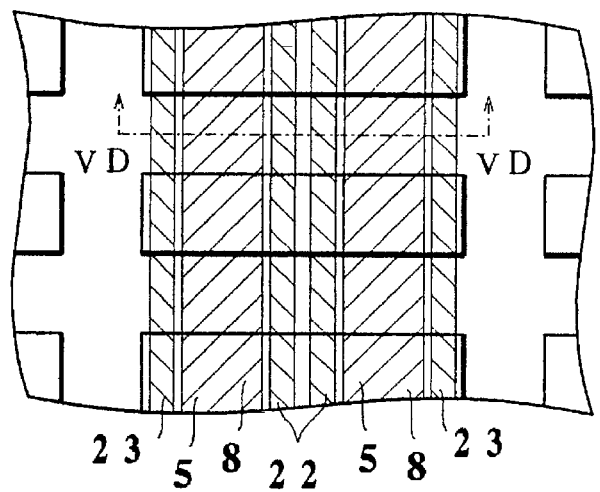
Figure 5D:
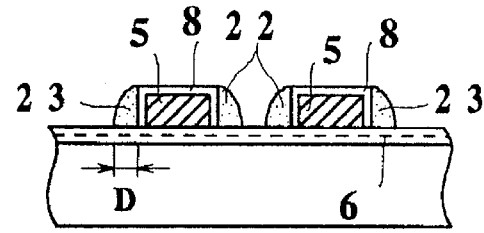

Next, on top of the resulting substrate, a layer 33 of silicon dioxide is deposited as shown in FIGS. 5A and 5B. FIG. 5B is a VB—VB sectional view to FIG. 5A. Thereafter, the resulting substrate is subjected to anisotropic etching technique such as reactive ion etching (RIE) whereby insulating bodies 22 and 23 of silicon dioxide are formed on both sides of the memory gate electrode 5 and remained on the insulating layer 6 as shown in FIGS. 5C and 5D. FIG. 5D is a VD—VD sectional view to FIG. 5C.

Note that isotropic etching is a technique of etching in both the lateral direction and the vertical direction while anisotropic etching is a technique of etching in only the vertical direction.

Reactive ion etching may continue until the surface of the insulating layer 6 is exposed. But reactive ion etching may as well to continue until the portion of the insulating layer 6 is removed. That is because reactive ion etching is the technique of etching in only the vertical direction and therefore have little influence on the width of the insulating body 23. In other word, the width D of the insulating body 23 can be controlled easily. Therefore, the width of the region 10b can be controlled easily.

Specifically, the width D of the insulating body 23 is determined by thickness of the layer 33. Furthermore, the thickness of the layer 33 can be controlled correctly.

Figure 6A:
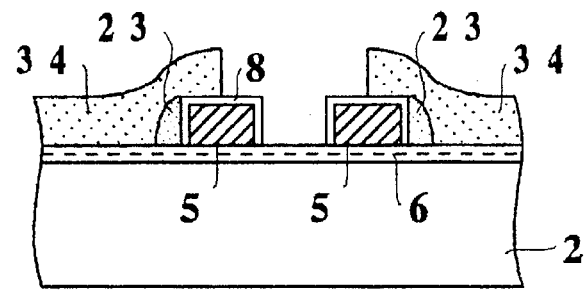
FIGS. 6A through 6E are views showing the manufacturing process of the memory circuit 31.
Figure 6B:
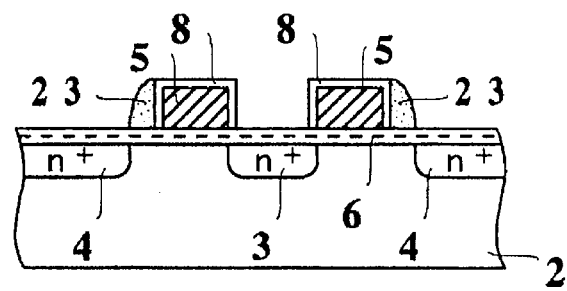

Referring to FIG. 6A, after the insulating bodies 23 on one side of the memory gate electrode 5 are then covered with a mask of photoresist the insulating bodies 22 on the other side of the memory gate electrode are removed by etching technique. Referring to FIG. 6B, after the mask of photoresist is removed the substrate is subjected to an ion implantation step wherein sources and drains of N+ type diffusion regions is formed in the well 2.

Figure 6C:
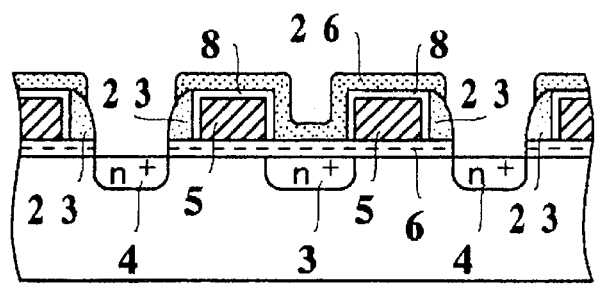

Referring to FIG. 6C, after an insulating layer 26 of silicon dioxide is deposited on the entire surface of the resulting substrate by CVD technique an opening for a first region electrode 24 is created in the insulating layer 6.

Figure 6D:
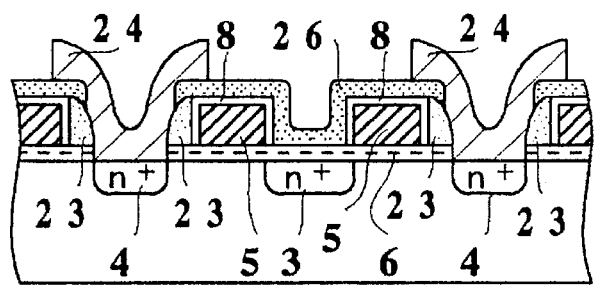

Referring to FIG. 6D, a layer of polycide is then deposited on the entire surface of the substrate and form into the first region electrode 24 by etching of a photoresist pattern as a mask.

Figure 6E:
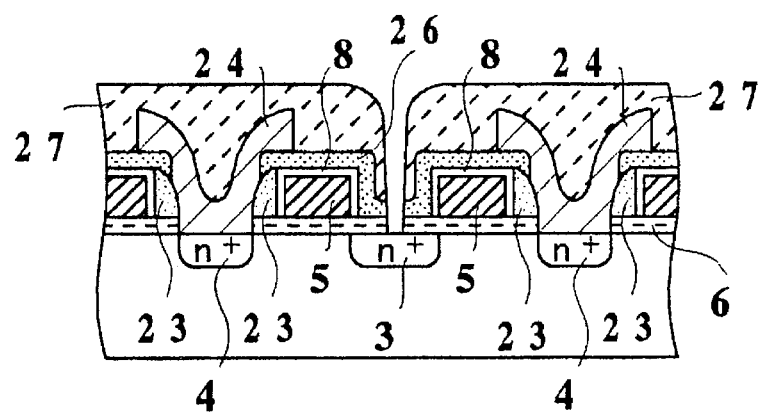

Referring to FIG. 6E, a layer 27 of silicon dioxide is provided for on the entire surface of the resulting substrate. After the opening for an electrode to be attached to drain is creating in the layer 27 and a layer of silicon aluminum is deposited on the surface of the resulting substrate, the layer form into bit lines 29 which are drain lines by etching using a photoresist pattern as a mask (see FIG. 3).

At last, a layer (not shown) of passivation is formed on the entire of the resulting substrate.

Although in the preferred embodiment the insulating layer 6 of the memory comprises the silicon dioxide layer 6a, the silicon nitride layer 6b and the silicon dioxide layer 6c, in alternative embodiments an insulating layer may comprises a silicon dioxide layer and a silicon nitride layer and also may comprise any one of layers provided that the layer can holding electrons at writing operation.

Although in the preferred embodiment the insulating layer 6 for holding electrons is formed on the surface of the well so as to span the first portion and the second portion, in alternative embodiments an insulating layer for holding electrons is formed on the surface of the well so as to span the first portion and an insulating film such as silicon oxide is formed on the entire surface of the second portion.

Although in the preferred embodiment the source 4 and the drain 3 are semiconductors of N+ type and the first portion 10a and the second portion 10b are semiconductors of P type, in alternative embodiments the two regions may also be semiconductors of P type and the two portions may be semiconductor of N+ type.

The memory circuit and manufacturing method therefor according to the above-described embodiment is characterized in that the space which the source 4 and the drain 3 define comprises the first portion 10a and the second portion 10b, that the memory gate electrode 5 spans the first portion 10a, and that the insulating body spans the second portion 10b and is adjacent to the memory gate electrode 5.

Therefore, compared with the memory circuit constructed using by two-transistor cell, the above-mentioned memory circuit have advantages in integrating the memory circuit, and in controlling the width of the second portion. These advantage permit the cell of the memory circuit to integrate, the memory circuit to be easy to manufacture, the manufacturing expense to be cut down and the predetermined width of the second portion 10b to be manufacture correctly.

The method for operating the memory circuit according to the above-described embodiment comprises steps of arraying the memories in rows and columns, connecting each of drain lines to all the drains of the memories arrayed in a row, connecting each of gate lines to all the memory gate electrodes of the memories arrayed in a column, connecting a source line to all the sources of the memories arrayed in rows and columns, to write data into a desired memory, applying the first programming voltage to a gate line connecting with the desired memory and applying the voltage to the drains of the undesired memories in order not to write data into the undesired memories, and to read data from a desired memory, determining whether or not a current flows through a drain line connecting to the drain of the desired memory when the first sense voltage is applied to a gate line connecting with the memory gate electrode of the desired memory as well as applying the first reading voltage to the source line.

Therefore, it is possible to provide nonvolatile semiconductor memory circuit that comprises one-transistor cells and yet is able to write data into and read data from a desired memory cell without mistake. As a result of this, compared with the memory circuit constructed using by two-transistor cell, the above-mentioned memory circuit have advantages in integrating the memory circuit as well as its memory cell, and in cutting down the manufacturing expense.

Another embodiment according to the present invention will be described with reference to the figures.

Figure 8:
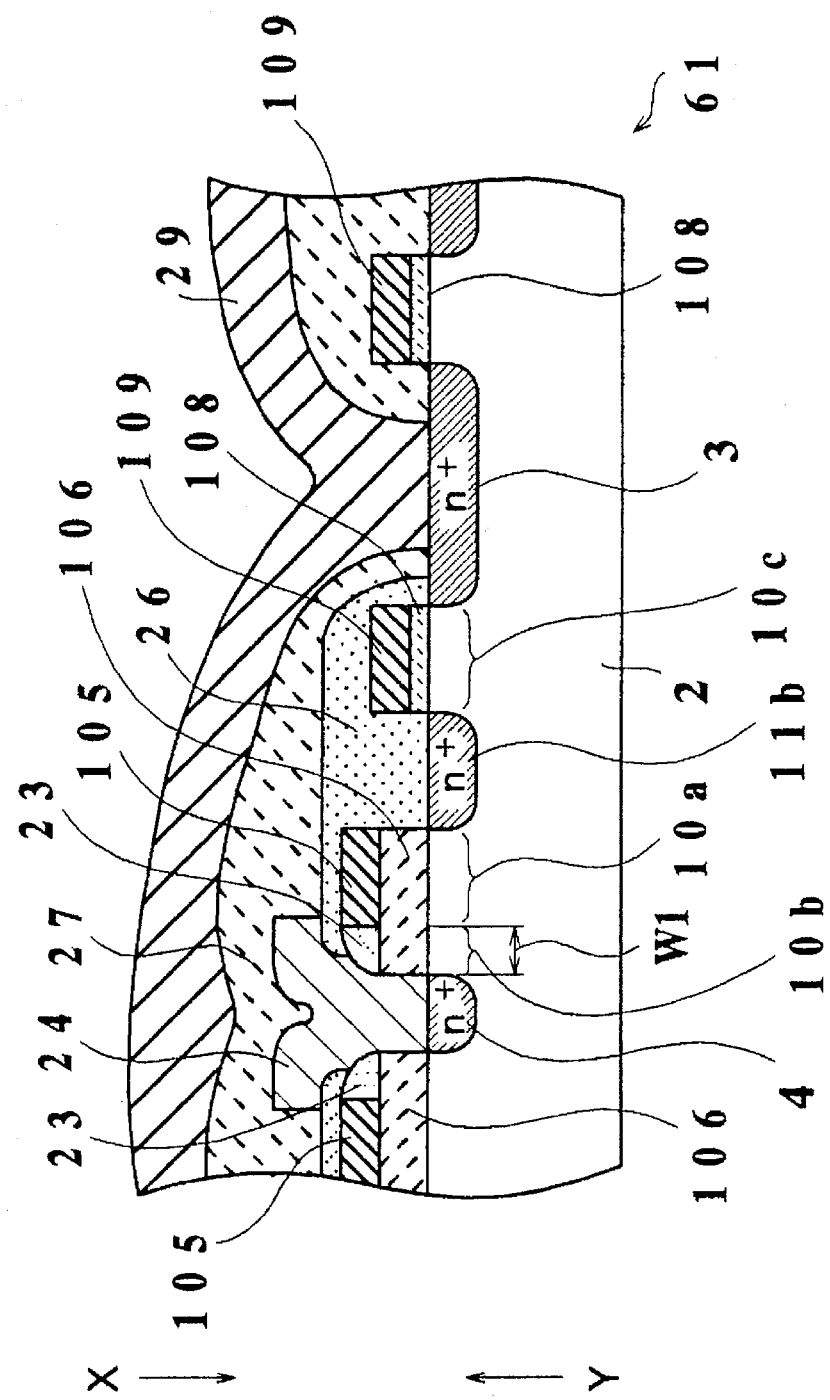
FIG. 8 is a sectional view showing schematically a nonvolatile memory 61 according to another embodiment of the present invention.

FIG. 8 shows in section a nonvolatile memory 61 according to the embodiment of the present invention. The nonvolatile memory 61 comprises a memory storage element and a switching element. The memory storage element is a field effect transistor with a source 4 of a first region, a drain 11b of a second region and a memory gate electrode 105 of a first control electrode. The switching element is a field effect transistor with a source 11b, a drain 3 of a third region and a drain gate electrode 109 of a second control electrode. That is, the drain of the memory storage element connects with the source of the switching element. Note that in this circuit the source 4 of the memory storage element, the drain 3 of the switching element and the memory gate electrode 105 are defined as a source, a drain and a memory gate electrode of the nonvolatile memory 61, respectively.

Referring to the memory storage element specifically, in the surface of the well 2 formed in the surface of a silicon substrate, the source 4 and the drain of the memory storage element is provide which are both N+ type diffusion region. A film 106 of ferroelectric material such as PbTiO$_3$ spans a space between the source 4 and the drain 3. The memory gate electrode 105 is applied on the surface of the ferroelectric film 106, spanning a first portion 10a of the surface of the space. An insulating body 23 is applied on the surface of the ferroelectric film 106 so that it can connect with the memory gate electrode 105 and span a second portion 10b of the surface of the space. A source electrode 24 is attached to the source 4.

Referring to the switching element specifically, the drain 3 of the switching element is provided for the well 2. The source of the switching element is the diffusion region 11b adjacent to the first portion 10a. An insulating layer 108 is applied on a space 10c which the source and the drain of the switching element define. Furthermore, the drain gate electrode 109 is applied on the insulating layer 108, spanning the space 10c.

An insulating layer 26 covers all of the insulating bodies 23, the memory gate electrode 105 and the drain gate electrode 109. The entire surface of both the insulating layer 26 and the source electrode 24 is covered with an insulating layer 27 on which is a bit line 29 of aluminum connecting to all drains 3 of the memories 61 arrayed in a row (not shown).

Figure 9:
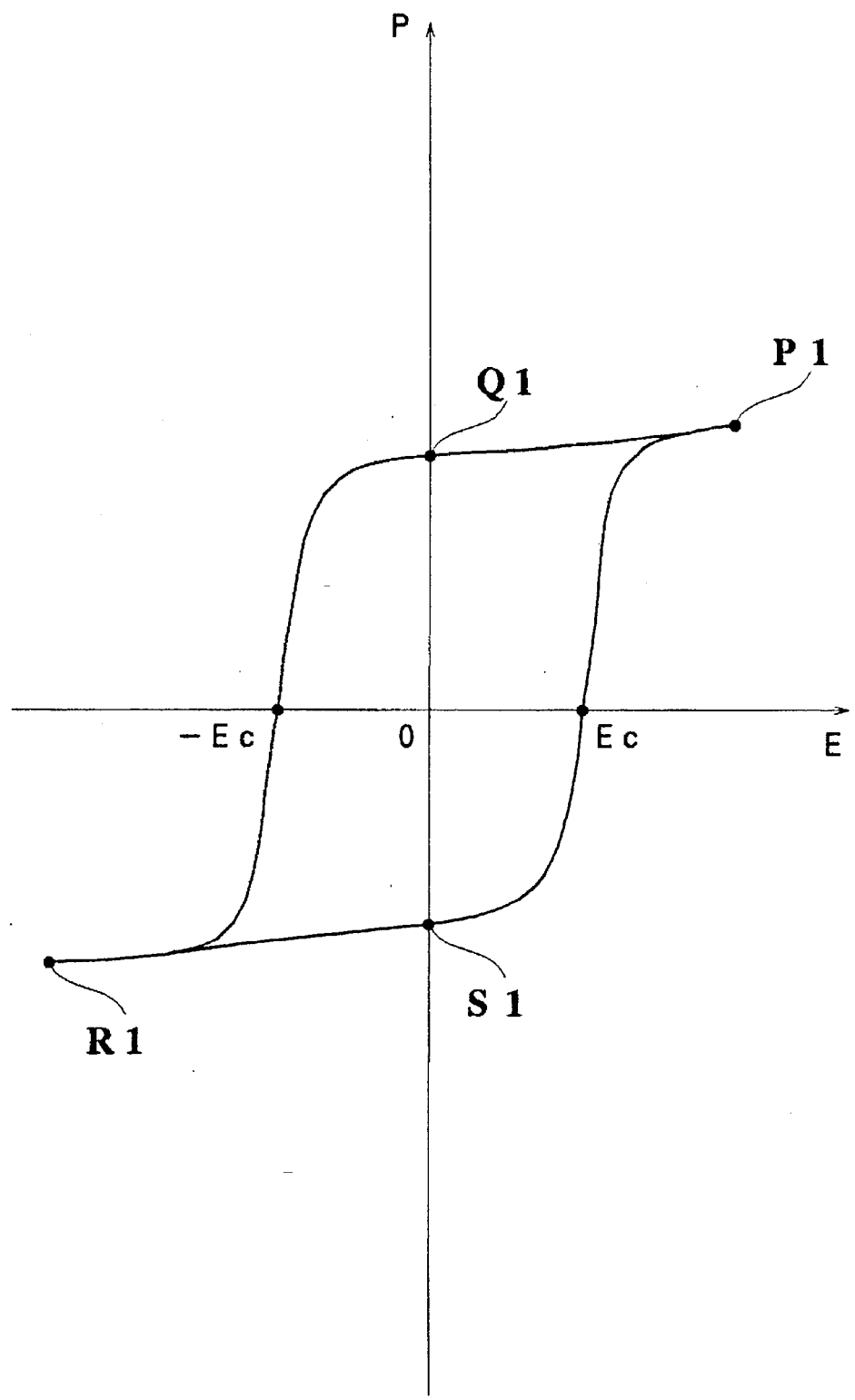
FIG. 9 is a view showing the hysteresis loop for the ferroelectric film of the nonvolatile memory 61.

There will now be described the principle of writing data into the nonvolatile memory and erasing data stored in the nonvolatile memory referring to E-P hysteresis loop of the ferroelectric film 106 shown in FIG. 9. The vertical axis in FIG. 9 represents polarization P and the horizontal axis in FIG. 9 represents electric field E.

In order to write one data into the nonvolatile memory 61, a voltage of grand potential is applied to the well 2 and a programming voltage whose power is larger than a positive coercive voltage is applied to the memory gate electrode 105. Note that the coercive voltage is a voltage applied to the memory gate electrode 105 which removes the existing negative polarization of the ferroelectric film 106. At that time, an electric field develops between the well 2 and the memory gate electrode 105 and thereby the ferroelectric film 106 is polarized into a direction X parallel to the electric field, as symbolized by point P1 in FIG. 9. In addition, this polarization will remain as it is even if the gate voltage is cut off, as symbolized by point Q1 in FIG. 9. This status in polarization of the ferroelectric film 106 mean that the one data has been written into the memory. In the memory having the one data, the first portion 10a changes into conductive.

Such a programming voltage is of "second programming" voltage such that the ferroelectric film 106 is polarized into the direction X parallel to the electric field developed.

On the other hand, in order to erase the one data from the memory or to write the other data therein, ground potential is applied to the P type well 2 and less programming voltage than negative coercive voltage is applied to the memory gate electrode 105. At that time, an electric field of the opposite polarity to that used when writing the one data between the well 2 and the memory gate electrode 105 and thereby the ferroelectric film 106 is polarized into a direction Y parallel to the electric field, as symbolized by point R1 in FIG. 9. In addition, this polarization will remain as it is even if the gate voltage is cut off, as symbolized by point S1 in FIG. 9.

This status in polarization of the ferroelectric film 106 mean that the one data has been erased or the other data has been written into the memory. In the memory with the other data, the first portion 10a get nonconductive.

The operation of reading information from the nonvolatile memory will be described below.

To the drain gate electrode 109 is applied a positive voltage of "second reading" voltage at reading operation. Note that the "second reading" voltage is such a voltage applied to the drain gate electrode 109 that the space 10c can change from nonconductive into conductive with making no change in polarization state of the ferroelectric film 106. At that time, the second portion 10b is conductive because the existing depletion layer in PN junction between the source 4 and the well 2 is enlarged by the positive voltage.

Magnitude of the second reading voltage depends on the width of the second portion 10b. In this embodiment the second reading voltage is the positive voltage of 5 V as the width of the second portion 10b is 0.2 μm.

At the same time, A voltage of 0 V of "second sense" voltage is applied to the memory gate electrode 105 relative to the well 2.

Note that the "second sense" voltage is a voltage applied to the memory gate electrode 105 relative to the well 2 which lies between such a minimum voltage that the first portion 10a can change from nonconductive into conductive when the ferroelectric film 106 is polarized into the direction X, and such a minimum voltage that the first portion 10a changes from nonconductive into conductive when the ferroelectric film 106 is polarized into the direction Y.

Therefore, when the second reading voltage and the second sense voltage are applied to the source 4 and the memory gate electrode 105 of the memory storage element with the ferroelectric film 106 polarized into the direction X respectively, a current flows between the diffusion region 4 and the diffusion region 3. That is why all of the first portion 10a, the second portion 10b and the space 10c is conductive and a potential difference therebetween is generated by the second reading voltage. As is described above, the second reading voltage for changing the second portion 10b into conductive is used to generate the potential difference therebetween.

On the other hand, when the ferroelectric film 106 is polarized into the direction Y, no current flows between the diffusion region 4 and the diffusion region 3 even when the second reading voltage and the second sense voltage are applied to the source 4 and the memory gate electrode 105 respectively. That is why the first portion 10a remains nonconductive.

As is described above, it can be determined whether or not the memory is in "write" state, by determining whether or not a current flows between the diffusion region 3 and the diffusion region 4 when the second sense voltage is applied to the memory gate electrode 105 as well as changing the space 10c into conductive and changing the second portion 10b into conductive by application of the second reading voltage to the source 4. Note that the "write" state means the ferroelectric film 106 is polarized into the direction X.

To erase the written data stored in the memory, it is necessary to apply a vias opposite to that of writing operation between the well 2 and the memory gate electrode 105. At that time, the ferroelectric film 106 is polarized into the direction Y.

A memory circuit 71 can be composed of the above-mentioned memories which array in rows and columns. The memory circuit 71 is shown in partial view of equivalent circuit in FIG. 13A.

Figures 13A, 13B:
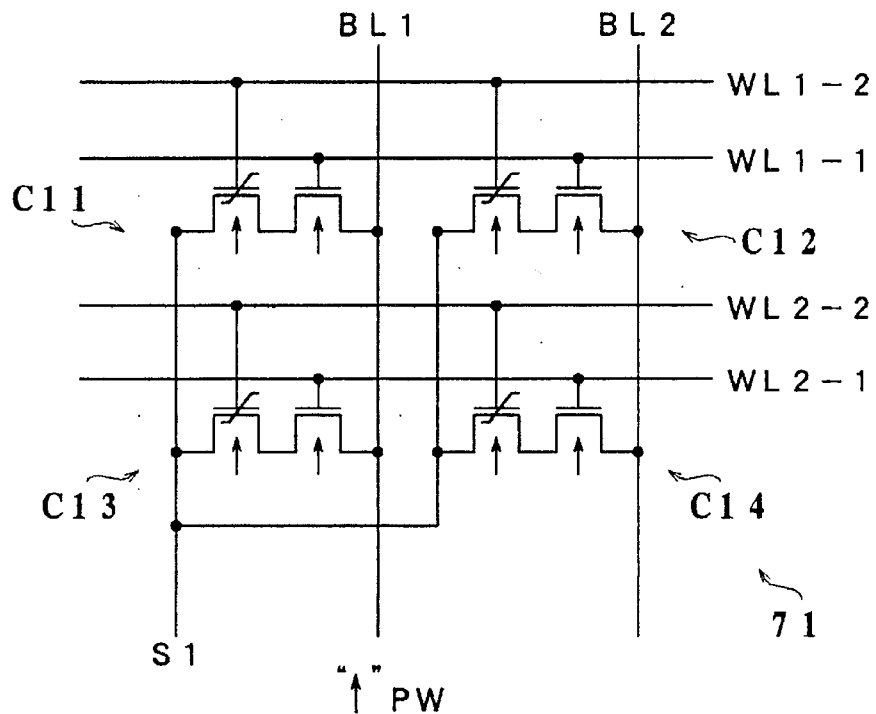
FIG. 13A is a partial equivalent conceptual view showing a memory circuit 71 constructed by using the nonvolatile memory 61 and FIG. 13B is a table showing an example of combinations of voltage applied to each of the individual lines at writing, erasing and reading operation.

As shown in FIG. 13A, each of the word lines WL1-2 and WL2-2 of gate lines connects with all the memory gate electrodes of the memories arrayed in a column. Each of the word lines WL1-1 and WL2-1 of drain gate lines connects with all the drain gate electrode of memories arrayed in a column. Each of the bit lines BL1 and BL2 of drain lines connect with all the drain of memories arrayed in a row, a source line S1 connects with all the source 4 of memories arrayed in rows and columns and a well line PW connects with all the well 2 of the memories arrayed in rows and columns.

So as not to write data into and read from memories but a desired memory, the following means can select a desired memory from the memory circuit.

FIG. 13B is a table showing an example of combinations of voltages applied to each of the individual lines at erasing, writing and reading operation, the combination permitting the memory circuit to select a desired memory, specifically, a memory C11 at writing and reading operation.

More specifically, it is effected by applying a second programming voltage of 5 V to the word line WL1-1, applying a voltage of 5 V to the word line WL1-2 and the bit line BL2, applying a voltage of 0 V to the source line S1 or leaving the source line S1 floating and applying a voltage of 0 V to the other individual lines to write data into the selected memory C11.

Returning to FIG. 13A, the memory gate electrode 105 have a positive potential of 5 V relative to both the source 4 and the drain 3 and thereby the ferroelectric film 106 is polarized into the direction X parallel to the electric field generated between the well and the memory gate electrode 105.

Referring to the nonselected memory C12, the space 10c is conductive because the voltage of 5 V is applied to the drain gate electrode 109. The first portion 10a is conductive because the voltage of 5 V is applied to the memory gate electrode 105. Therefore, as the voltage of 5 V is applied to the drain 3 the first portion 10a gets a voltage of 5 V. At that time, there is no potential difference between the memory gate electrode 105 and the well 2.

Referring to the other nonselected memory C14, the voltage of 5 V is applied to the drain 3 and the voltage of 0 V is applied to the memory gate electrode 105. Note that, in nonvolatile memory utilizing a film of ferroelectric properties, polarization state of the film may change when a positive voltage is applied to a drain or a source of the nonvolatile memory relative to a control gate electrode thereof. To prevent that, in the memory C14 the space 10c is left nonconductive by applying the voltage of 0 V to the drain gate electrode 109.

Referring to the other nonselected memory C13, since the memory gate electrode 105 and the well 2 have the voltage of 0 V applied the ferroelectric film 106 is not polarized into the direction X. That is, the memory C13 is not in write state.

As is described above, the switching elements are used for preventing data from being written into such memories as the memory C14.

Note that the second portion 10b of memories C12 and C14 remain nonconductive because of the voltage of 0 V applied to the source line S1. Therefore, the voltage of 5 V applied to the bit line BL2 can travel into the first portion 10a of the memory C12 without a loss.

Reading operation is effected by applying a voltage of 5 V to the word line WL1-1, applying a second reading voltage of 5 V to the source line S1, applying a second sense voltage of 0 V to the word line WL1-2, leaving the bit line BL2 floating and applying a voltage of 0 V to each of the other individual lines. A sense amplifier (not shown) is provided for the bit line BL1.

Returning to FIG. 13A and referring to the selected memory C11, the second portion 10b is conductive because the depletion layer generated in PN junction between the source 4 and the well 2 is enlarged by application of the second reading voltage of 5 V to the source line S1 (see FIG. 3). Also, the space 10c is conductive because of the voltage of 5 V applied to the word line WL1-1. At that time, when the memory is in the write state the first portion 10a is conductive. Therefore, a current flows between the source and the drain and comes in the sense amplifier connecting to the bit line BL1.

On the other hand, when the memory is not in the write state the first portion 10a is nonconductive. Therefore no current flows between the source 4 and the drain 3 even when the second portion 10b and the space 10c are both conductive. That is, the sense amplifier receives no current.

Referring to the nonselected memory C12, the second portion 10b is conductive because the second reading voltage of 5 V is applied to the source line S1. The bit line BL2 is, however, not connecting with the sense amplifier. Therefore, the sense amplifier can not read data from the memory C12. Note that a voltage of 0 V may be applied to the bit line BL2.

Referring to the nonselected memories C13 and C14, because the word line WL2-1 have the voltage of 0 V applied thereto and thereby the space 10c is nonconductive, no current flows between the source 4 and the drain 3.

As is described above, in the memory circuit, data can be written into and read from a desired memory.

Meanwhile, erasing operation is effected by applying a voltage of 10 V to both the well line PW and the word line WL2-2, applying a voltage of 0 V to the other individual lines.

Referring to the selected memory C11 and C12, since the well line PW have the voltage of 5 V and the memory gate electrode 105 have the voltage of 0 V, the electric field opposite to writing operation developed between the well 2 and the memory gate electrode 105 return the polarization of the film 106. That means the data of the memories has been erased.

Referring to the nonselected memories C13 and C14, since the well 2 have the voltage of 5 V and the memory gate electrode 105 have the voltage of 5 V, no electric field develops between the well 2 and the memory gate electrode 105. Therefore, the data of the memories is left unchanged.

Note that when the voltage of 5 V is applied to the word line WL2-2 as well as the word line WL1-2 data can be erased from all the memories at the same time.

As is described above, the memory 61 has the second portion 10b defined by the insulating body 23. Therefore, in reading operation, the second reading voltage can be used to determine whether or not a current flows between the source 4 and the drain 3 as well as changing the second portion 10b from nonconductive into conductive.

The manufacturing process for a memory circuit constructed using the memory cells 61 will be described below.

Figure 10A:
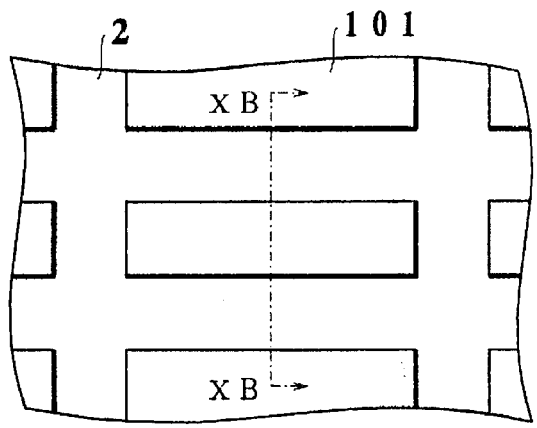
FIGS. 10A through 10F are views showing the manufacturing process of the memory circuit 71.
Figure 10B:
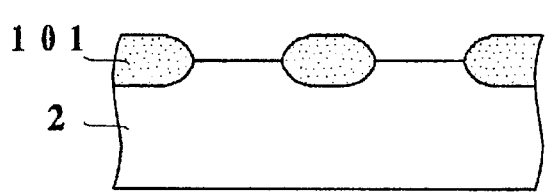

Field oxide layers 101 are formed in a well 2 which are provided for a substrate of semiconductor as shown in FIG. 10A by Local Oxidation of Silicon (LOCOS) technique to divide the substrate into the plural insulated islands. Note that FIG. 10B is a XB—XB sectional view to FIG. 10A. In the embodiment, the depth of the field oxide layer 101 is 600 nm.

Figure 10C:
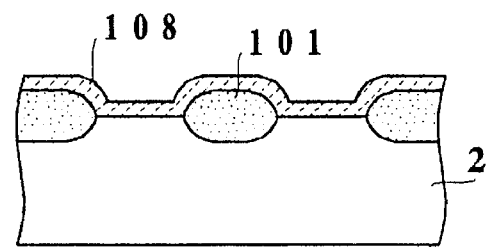
Figure 10D:
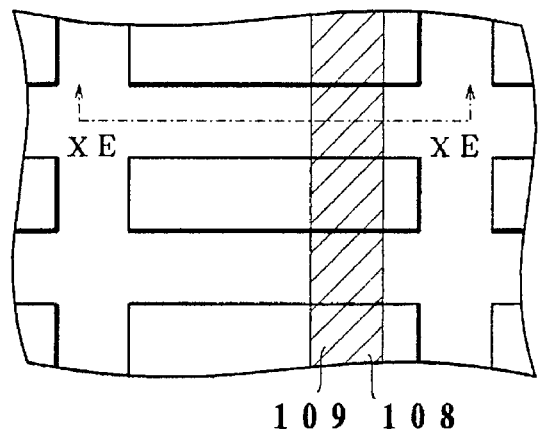
Figure 10E:
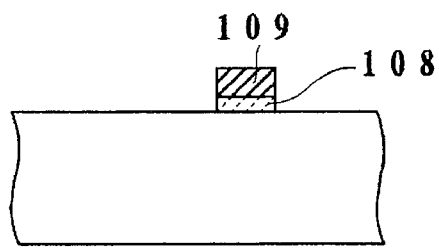

Referring to FIG. 10C, after cleaning the substrate a silicon dioxide layer 108 is 5 nm in thickness formed on the substrate by oxidation technique. Referring to FIG. 10D, a layer of polycide is deposited on the entire surface of the silicon dioxide layer 108 by CVD technique and then a silicon dioxide film 108 and a drain gate electrode 109 of polycide is formed etching using a photoresist pattern as a mask. Note that FIG. 10E is a XE—XE sectional view to FIG. 10D.

Figure 10F:
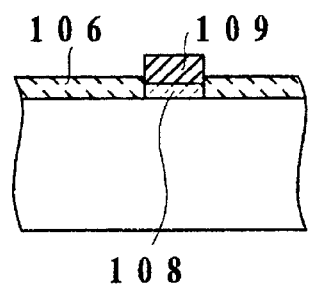

Referring to FIG. 10F, on the surface of the resulting substrate, a ferroelectric film 106 made of PbTiO$_3$ is formed by a RF(radio-frequency) deposition sputtering method and heat treatment for several hours on conditions that target diameter is 80 mm, target substrate space is 35 mm, target PR voltage is 1.6 kV, sputtering power is 150 W, sputtering gas made of Ar and O$_2$ (Ar:O$_2$=9:1), gas pressure is 2×10$^{-2}$ torr., temperature of the substrate is 400° to 500° C. and sputtering rate is 3 nm per minute. Noted that target need adding with excessive 10 wt % for compensation of deficient Pb in the deposited film and temperature of substrate keeps 400° C. during shutting and 500° during heat treatment.

Figure 11A:
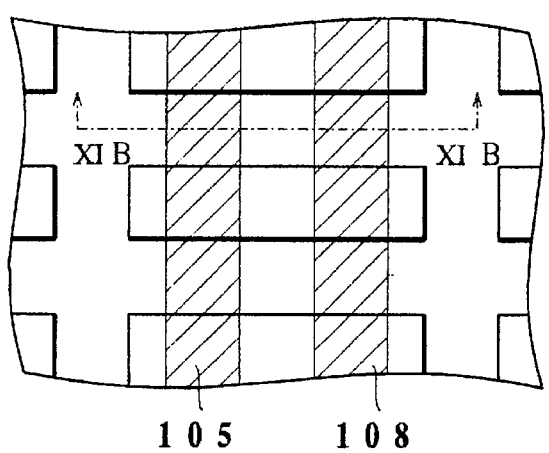
FIGS. 11A through 11F are views showing the manufacturing process of the memory circuit 71.
Figure 11B:
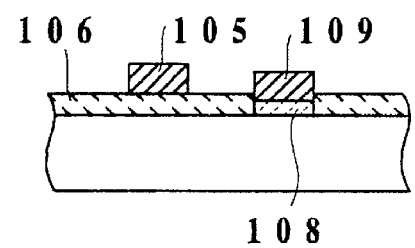

Referring to FIG. 11A, a layer of polycide is deposited on the entire surface of the resulting substrate and form into the memory gate electrode 105 by etching using a photoresist pattern as a mask. FIG. 11B is a XIB—XIB sectional view to FIG. 11A.

Figure 11C:
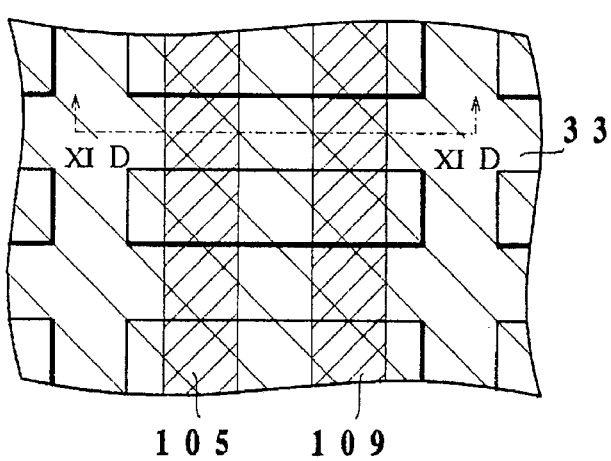
Figure 11D:
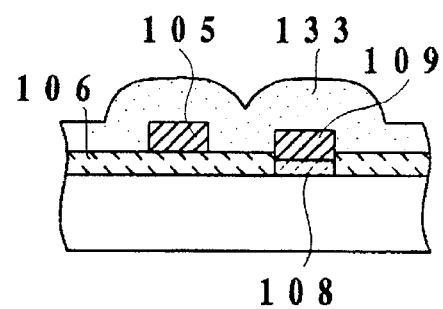
Figure 11E:
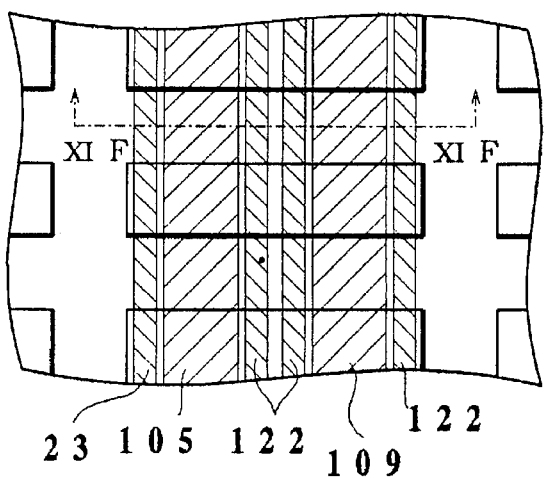
Figure 11F:
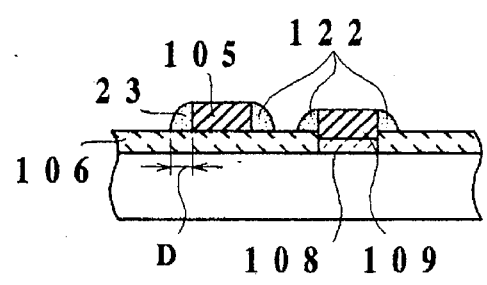

Next, referring to FIGS. 11C and 11D, on top of the resulting substrate, a layer 133 of insulator is deposited. FIG. 11D is a XID—XID sectional view to FIG. 11C. Thereafter, the resulting substrate is subjected to anisotropic etching technique such as reactive ion etching (RIE) whereby insulating bodies 122 and 23 of polysilicon are formed so that they connect with both sides of the memory gate electrode 105 and the drain gate electrode 109 as shown in FIGS. 11E and 11F. FIG. 11F is a XIF—XIF sectional view to FIG. 11E.

Note that isotropic etching is a technique of etching in both the lateral direction and the vertical direction while anisotropic etching is a technique of etching in only the vertical direction.

Reactive ion etching may continue until the surface of the ferroelectric film 106 is exposed. But reactive ion etching may as well to continue a few time after the surface of the ferroelectric film 106 is exposed. That is because reactive ion etching is the technique of etching in only the vertical direction and at that time have little influence on the width D of the insulating body. In other word, the width D of the insulating body can be controlled easily Specifically, the width D of the insulating body 23 is determined by thickness of the layer Furthermore, the thickness of the layer 33 can be controlled correctly.

Figure 12A:
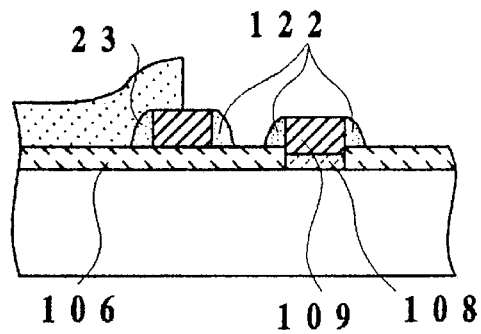
FIGS. 12A through 12E are views showing the manufacturing process of the memory circuit 71.
Figure 12B:
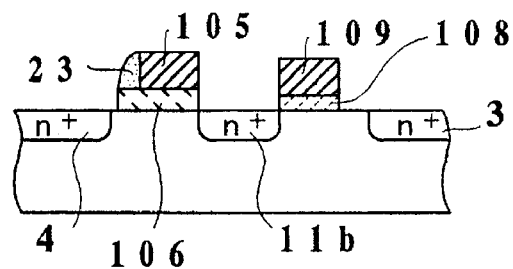

Referring to FIG. 12A, after the insulating bodies 23 on one side of the memory gate electrodes 105 are then covered with a mask of photoresist the other insulating bodies 122 are removed by etching technique. Referring to FIG. 12B, after the mask of photoresist is removed the resulting substrate is subjected to an ion implantation step whereby sources 4, diffusion region 11b and drains 3 of N+ type diffusion regions are formed in the well 2.

Figure 12C:
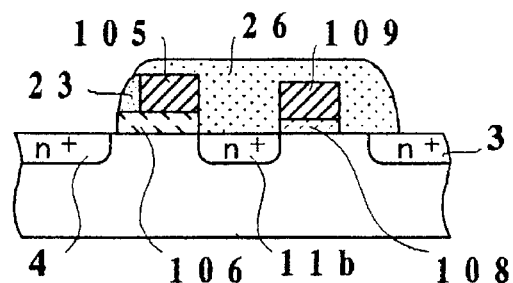
Figure 12D:
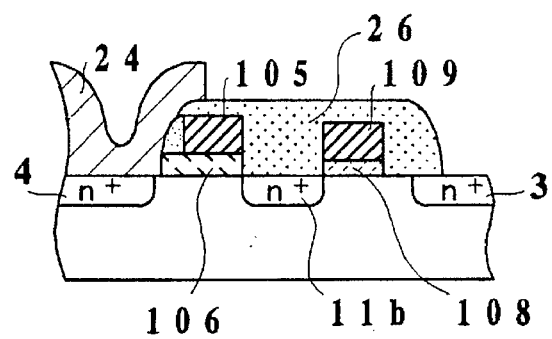

Referring to FIG. 12C, after an insulating layer 26 of silicon dioxide is deposition on the entire surface of the resulting substrate by CVD technique openings for source region electrodes are created in the insulating layer 26. Referring to FIG. 12D, a layer of polycide is then deposited on the entire surface of the substrate using photoresist and form into the source region electrode 24 by etching of a photoresist pattern as a mask.

Figure 12E:
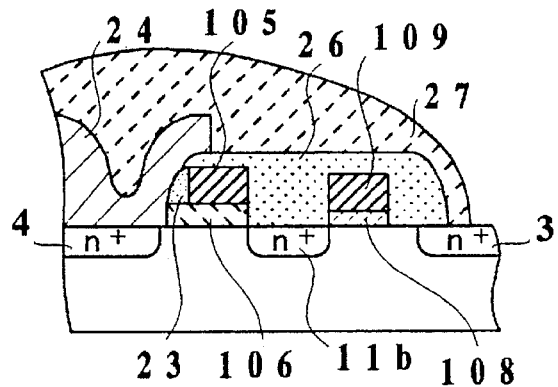

Referring to FIG. 12E, a layer 27 of silicon dioxide is provided for the top of the resulting substrate. After the openings for electrodes to be attached to drain are creating in the layer 27 and a layer of silicon aluminum is deposited on top of the resulting substrate, the layer of silicon aluminum forms into bit lines 29 which are drain lines by etching using a photoresist pattern as a mask (see FIG. 8).

At last, a layer (not shown) of passivation is formed on the resulting substrate.

Although in the preferred embodiment the ferroelectric film 106 is formed on the surface of the well so as to span the first portion and the second portion, in alternative embodiments a ferroelectric film is formed on the surface of the well so as to span the first portion and an insulating film such as silicon oxide is formed on the entire surface of the second portion.

Although in the preferred embodiment the ferroelectric film 106 is made of PbTiO$_3$ material, in alternative embodiments it may comprise any one of the known reversibly polarizable ferroelectric materials, such as barium titanate (BaTiO$_3$), bismuth titanate (BiTiO$_3$), lead zirconate titanate and oxide including lead, lanthanum, zirconium titanium (PLZT).

Although in the preferred embodiment the source 4 and the drain 3 of the memories are semiconductors of N+ type, and the well 2 is semiconductors of P type, in alternative embodiments the source 4 and the drain 3 of the memories may also be semiconductors of P type and the well 2 may be semiconductor of N+ type.

As is described above, the present invention can apply to the nonvolatile memory utilizing ferroelectric properties: reversible polarization and remanent polarization.

The above-described method for operating the memory 61 according to another embodiment of the present invention comprises steps of arraying the memories in rows and columns, connecting each of drain lines to all the drains of the memories arrayed in a row, connecting each of gate lines to all the memory gate electrodes of the memories arrayed in a column, connecting each of drain gate lines to all the drain gate electrode of the memories arrayed in a column, connecting a source line to the sources of all the memories arrayed in rows and columns, to write data into a desired memory, applying the second programming voltage to a gate line connecting with the desired memory and applying the voltage to the drains of the undesired memories in order not to write data into the undesired memories, and to read data from a desired memory, determining whether or not a current flows through a drain line connecting to the drain of the desired memory when the second sense voltage is applied to a gate line connecting with the memory gate electrode of the desired memory as well as applying the second reading voltage to the source line.

Therefore, it is possible to provide nonvolatile semiconductor memory circuit utilizing the ferroelectric properties that is able to write data into and read from a desired memory without mistakes.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device having a nonvolatile memory, comprising:
   a semiconductor substrate of a first conductivity type having an upper surface;
   a first insulator for holding electrons on said substrate;
   said first insulator being substantially flat;
   a control electrode on said first insulator;
   said control electrode having a first end and a second end;
   a second insulator portion atop said substrate and adjacent said first end;
   said second insulator having a second end;
   a first region of a second conductivity type in said substrate;
   an end of said first region being defined by said second end of said second insulator
   a second region of said second conductivity type in said substrate; further comprising:
     a first region electrode overlying, and connected to, said first region;
     said first region electrode having an edge;
     said edge being defined by said second end of said second insulator; and
     said second insulator portion having a width which is narrow enough such that a conductive channel is formed in a portion of said upper surface of said semiconductor substrate beneath said second insulator portion only when a reading voltage is applied to said first region electrode.

2. Apparatus as in claim 1, wherein said first region electrode overlies, at least partly, said second insulator.

3. A semiconductor device having a nonvolatile memory, comprising:
   a semiconductor substrate having an upper surface;
   a first region of a first conductivity type in said upper surface;
   a second region of said first conductivity type in said upper surface and located a distance apart from said first region, whereby a space in said upper surface is defined between said first region and said second region;
   said space including a first portion and a second portion;
   a control electrode overlying said first portion;
   a first region electrode overlying and in contact with said first region;
   an insulating layer for holding electrons overlying said first portion between said control electrode and said first portion;
   said insulating layer being substantially flat;
   an insulating body overlying said second portion between said control electrode and said first region electrode;
   said insulating body having a width;
   said second portion being defined by said control electrode on one side and said first region electrode on another side;
   said width of said insulating body being defined by said control electrode on one side and said first region electrode on another side; wherein said first region electrode overlies no more than part of said control electrode, and
   said width of said insulating body being narrow enough such that a conductive channel is formed in said second portion of said upper surface only when a reading voltage is applied to said first region electrode.

4. A semiconductor device having a nonvolatile memory, comprising:
   a semiconductor substrate having an upper surface;
   a first region of a first conductivity type in said upper surface;
   a second region of said first conductivity type in said upper surface and located a distance apart from said first region, whereby a space in said upper surface is defined between said first region and said second region;
   said space including a first portion and a second portion;
   a control electrode overlying, said first portion;
   an insulating layer for holding electrons overlying said first portion between said control electrode and said first portion;
   said control electrode having top and side surfaces;
   an insulating layer covering said top and side surfaces;
   an insulating body adjacent to one of said side surfaces adjacent said second portion;
   said insulating body overlying said second portion and defining a width thereof;
   a first region electrode connected to said first region;
   said first region electrode overlying at least a portion of said insulating body; and
   said insulating body having a width which is narrow enough such that a conductive channel is formed in said second portion of said upper surface only when a reading voltage is applied to said first region electrode.

5. Apparatus as in claim 4, wherein said first region electrode overlies, at least partly, said first portion.

6. Apparatus as in claim 5, wherein said first region electrode overlies no more than part of said control electrode.

7. Apparatus as in claim 4, wherein said first region electrode overlies no more than part of said control electrode.

8. A semiconductor device having a nonvolatile memory, comprising:

a semiconductor substrate of a first conductivity type having an upper surface;

a first insulator for holding electrons on said substrate;

said first insulator being substantially flat;

a control electrode on said first insulator;

said control electrode having a first end and a second end;

a second insulator portion atop said substrate and adjacent said first end;

said second insulator having a second end;

a first region of a second conductivity type in said substrate;

an end of said first region being defined by said second end of said second insulator;

a second region of said second conductivity type in said substrate further comprising:

a first region electrode overlying, and connected to, said first region;

said first region electrode overlying, at least partly, said second insulator; and said second insulator portion having a width which is narrow enough such that a conductive channel is formed in a portion of said upper surface of said semiconductor substrate beneath said second insulator portion only when a reading voltage is applied to said first region electrode.

9. A semiconductor device including nonvolatile memories comprising:

a substrate of semiconductor of a first conductivity type;

a first region of a second conductivity type located in the surface of the substrate;

a second region of said second conductivity type located in the surface of the substrate and defining a space between the first region and the second region, the surface of the space comprising a first portion adjacent said second region and a second portion adjacent said first region;

an insulating layer for holding electrons spanning the first portion;

a control electrode on the insulating layer for holding electrons and spanning the first portion, the control electrode having a side surface;

an insulating body adjacent to the side surface of the control electrode and spanning the second portion;

a first region electrode having a side defined by a side of said insulating body and connected to and covering at least a portion of said first region;

an aluminum bit line connecting to a plurality of drains, wherein said plurality of drains are arrayed in a row; and said insulating body having a width which is narrow enough such that a conductive channel is formed in said second portion only when a reading voltage is applied to said first region electrode.

10. A semiconductor device including nonvolatile memories according to claim 9, wherein the insulating layer for holding electrons spans the first portion and the second portion.

11. A semiconductor device including nonvolatile memories according to claim 9, wherein the insulating layer comprises a silicon dioxide layer, a silicon nitride layer on the silicon dioxide layer and a silicon dioxide layer on the silicon nitride layer.

12. A semiconductor device including nonvolatile memories according to claim 9, wherein the insulating layer comprises a silicon dioxide layer and a silicon nitride layer on the silicon dioxide layer.

13. A semiconductor device including nonvolatile memories according to claim 9, wherein the first region and the second region are made of semiconductor of P type conductivity and the first portion and the second portion are made of semiconductor of N type conductivity.

14. A semiconductor device including nonvolatile memories according to claim 9, wherein the first region and the second region are made of semiconductor of N type conductivity and the first portion and the second portion are made of semiconductor of P type conductivity.

15. A semiconductor device including nonvolatile memories according to claim 9, wherein the first region is a source, the second region is a drain and the control electrode is a memory gate electrode.

16. A semiconductor device including nonvolatile memories according to claim 9, wherein a height of said insulating body is substantially the same as that of said control electrode, and a width of said insulating body is smaller than the height.

17. A semiconductor device including nonvolatile memories according to claim 9, wherein said insulating body lies on top of a portion of said insulating layer extending over said second portion.

18. A semiconductor device including nonvolatile memories according to claim 9, further comprising said first region electrode contacting the first region, the first region electrode spanning the insulating body electrically isolated from the control electrode.

19. Apparatus as in claim 9, further comprising:

said first region electrode overlying at least a portion of said insulating body; and an insulating layer between said insulating body and said first region electrode.

20. A semiconductor device including nonvolatile memories, comprising:

a semiconductor substrate having an upper surface;

a first region of a first conductivity type in said upper surface;

a second region of said first conductivity type in said upper surface and located a distance apart from said first region, whereby a first space in said upper surface is defined between said first region and said second region;

said space including a first portion and a second portion;

a first control electrode overlying said first portion;

a film of ferroelectric material for holding electrons overlying said first portion between said control electrode and said first portion;

said control electrode having top and side surfaces;

an insulating layer covering said top and side surfaces;

an insulating body adjacent to one of said side surfaces adjacent said second portion;

said insulating body overlying said second portion and defining a width thereof;

a source electrode connected to and overlying at least a portion of said insulating body;

a switching element connected to said second region;

said switching element including a third region in said substrate;

said switching element including a second space between said second region and said third region;

said switching element including a second control electrode overlying said second space; and a second drain region in said substrate.

21. A semiconductor device including nonvolatile memories according to claim 20, wherein the film of ferroelectric material spans the first portion and the second portion.

22. A semiconductor device including nonvolatile memories according to claim 20, wherein the first region is a source of the nonvolatile memory, the third region is a drain of the nonvolatile memory, the first control electrode is a memory gate electrode and the second control electrode is a drain gate electrode wherein the switching element turns on when a second programming voltage is applied to the drain gate control electrode.

23. A semiconductor device including nonvolatile memories according to claim 20, wherein the ferroelectric material is lead titanate.

24. A semiconductor device including nonvolatile memories according to claim 20, wherein the ferroelectric material is barium titanate.

25. A semiconductor device including nonvolatile memories according to claim 20, wherein the ferroelectric material is bismuth titanate.

26. A semiconductor device including nonvolatile memories according to claim 20, wherein the ferroelectric material is lead zirconate titanate.

27. A semiconductor device including nonvolatile memories according to claim 20, wherein the ferroelectric material is oxide including lead, lanthanum, zirconium and titanium.

* * * * *